(12) United States Patent
Adachi

(10) Patent No.: US 7,173,427 B1
(45) Date of Patent: Feb. 6, 2007

(54) MAGNETIC RESONANCE IMAGING APPARATUS AND MAGNETIC RESONANCE IMAGING METHOD

(75) Inventor: Kohei Adachi, Nasushiobara (JP)

(73) Assignees: Kabushiki Kaisha Toshiba, Tokyo (JP); Toshiba Medical Systems Corporation, Otawara (JP)

( * ) Notice: Subject to any disclaimer, the term of this patent is extended or adjusted under 35 U.S.C. 154(b) by 0 days.

(21) Appl. No.: 11/315,135

(22) Filed: Dec. 23, 2005

(51) Int. Cl.
*G01V 3/00* (2006.01)
(52) U.S. Cl. ...................... 324/322; 324/318
(58) Field of Classification Search ................ 324/322, 324/318, 319, 309, 307, 300; 600/410–422; 375/295, 299, 316, 347, 354
See application file for complete search history.

(56) References Cited

U.S. PATENT DOCUMENTS

| | | | |
|---|---|---|---|
| 4,825,162 A | 4/1989 | Roemer et al. | |
| 5,280,246 A * | 1/1994 | Takahashi et al. | 324/322 |
| 6,259,253 B1 | 7/2001 | Ellingson | |
| 6,564,081 B1 * | 5/2003 | Frigo et al. | 600/410 |
| 6,930,481 B2 * | 8/2005 | Okamoto et al. | 324/318 |
| 7,079,588 B1 * | 7/2006 | Doucette et al. | 375/295 |

FOREIGN PATENT DOCUMENTS

JP 2001-87243 4/2001

* cited by examiner

*Primary Examiner*—Brij B. Shrivastav
(74) *Attorney, Agent, or Firm*—Nixon & Vanderhye P.C.

(57) ABSTRACT

A magnetic resonance imaging apparatus includes a plurality of coils which receive magnetic resonance signals, a plurality of A/D converters which digitize the magnetic resonance signals, and a set unit which selectively sets a first state and a second state, the first state being set as a state in which the magnetic resonance signals output from the plurality of coils are input to the plurality of A/D converters, respectively, the second state being set as a state in which the magnetic resonance signal output from one of the plurality of coils is input to two or more of the plurality of A/D converters.

34 Claims, 5 Drawing Sheets

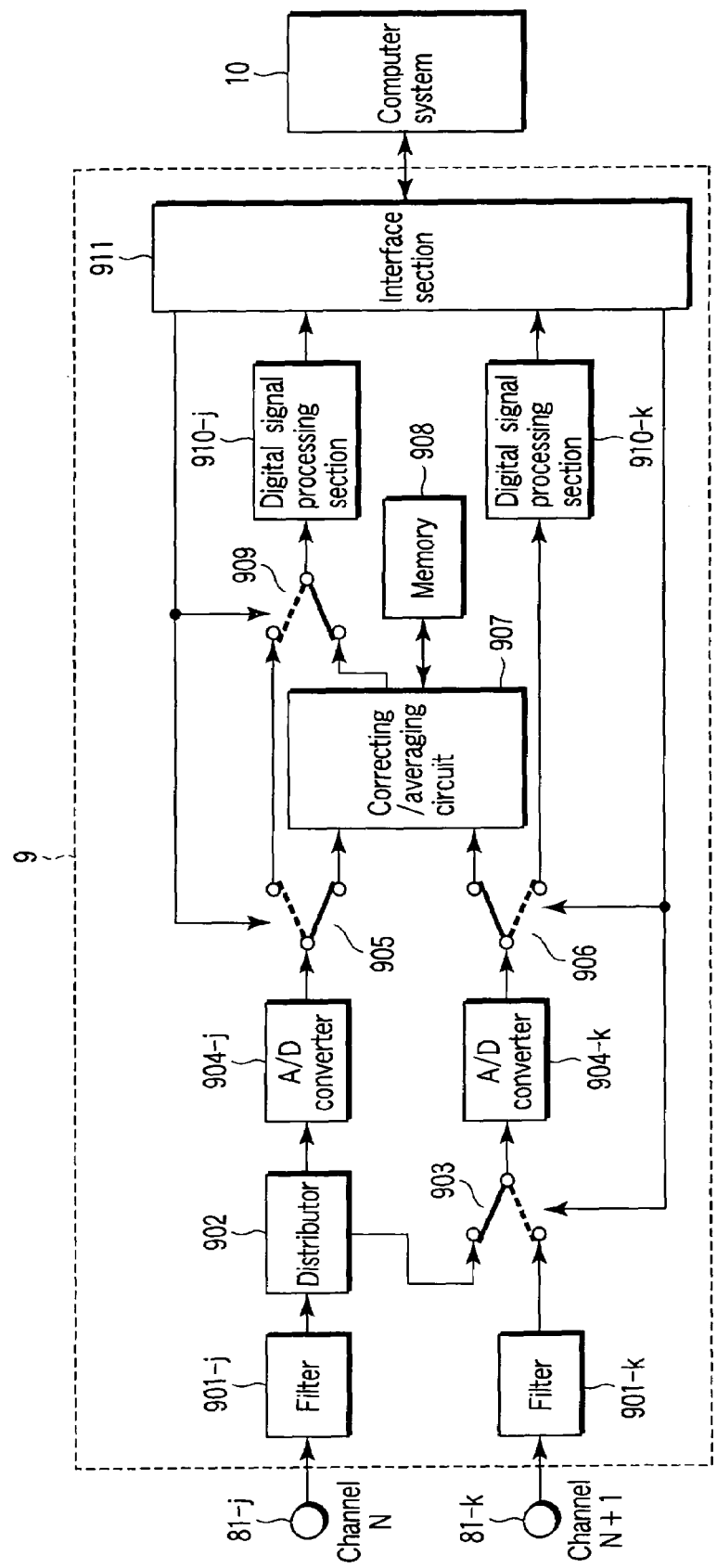
F I G. 2

MAGNETIC RESONANCE IMAGING APPARATUS AND MAGNETIC RESONANCE IMAGING METHOD

BACKGROUND OF THE INVENTION

1. Field of the Invention

The present invention relates to a magnetic resonance imaging (MRI) apparatus and magnetic resonance imaging method for reconstructing a magnetic resonance image by utilizing the magnetic resonance phenomenon.

2. Description of the Related Art

In recent magnetic resonance imaging apparatuses, an appropriate number of radio frequency (RF) coils, which varies in accordance with the part of a patient which is to be imaged, are arranged to improve a signal-to-noise ratio (SNR). In this case, the output signals of the RF coils are subjected to detection and analog-to-digital (A/D) conversion, etc. by respective receivers (as disclosed in, e.g., U.S. Pat. No. 4,825,162).

The number of RF coils to be used at the same time varies in accordance with the part of a patient which is to be imaged. For example, when a relatively large part, e.g., the whole body, is imaged, 32 RF coils are used at the same time. When a small part, i.e., the head or heart, is imaged, 8 RF coils are used at the same time.

Such a magnetic resonance imaging apparatus needs to receive channel signals equal in number to the maximum number of RF coils which can be used at the same time, and generally has A/D converters equal in number to the number of the RF coils. In the above case, 32 A/D converters are provided.

However, in the above magnetic resonance imaging apparatus, not all the provided A/D converters are used regardless of which part of the patient is imaged; that is, there are cases where only some of the A/D converters are used.

BRIEF SUMMARY OF THE INVENTION

In order to improve the function of a magnetic resonance imaging apparatus, it is preferable that the prepared A/D converters be efficiently used.

According to a first aspect of the present invention, there is provided a magnetic resonance imaging apparatus comprising: a plurality of coils which receive magnetic resonance signals; a plurality of A/D converters which digitize the magnetic resonance signals; and a unit which selectively sets a first state and a second state, the first state being set as a state in which the magnetic resonance signals output from the plurality of coils are input to the plurality of A/D converters, respectively, the second state being set as a state in which the magnetic resonance signal output from one of the plurality of coils is input to two or more of the plurality of A/D converters.

According to a second aspect of the present invention, there is provided a magnetic resonance imaging apparatus comprising: a static magnetic field coil which applies a static magnetic field to an object to be examined; a gradient coil which applies a gradient magnetic field to the object; a plurality of coils which receive magnetic resonance signals from the object; a plurality of A/D converters which digitize the magnetic resonance signals; a unit which selectively set a first state and a second state, the first state being set as a state in which the magnetic resonance signals output from the plurality of coils are input to the plurality of A/D converters, respectively, the second state being set as a state in which the magnetic resonance signal output from one of the plurality of coils is input to two or more of the plurality of A/D converters, and a unit which reconstructs an image based on outputs of the plurality of A/D converters.

According to a third aspect of the present invention, there is provided a magnetic resonance imaging method comprising: receiving magnetic resonance signals with a plurality of coils; in a first state, digitizing the magnetic resonance signals output from the plurality of coils, with a plurality of A/D converters; and in a second state, digitizing the magnetic resonance signal output from one of the plurality of coils to two or more of the plurality of A/D converters, with said two or more of the plurality of A/D converters.

According to a fourth aspect of the present invention, there is provided a magnetic resonance imaging method comprising: applying a static magnetic field to an object to be examined; applying a gradient magnetic field to the object; receiving magnetic resonance signals from the object with a plurality of coils; in a first state, digitizing the magnetic resonance signals output from the plurality of coils, with a plurality of A/D converters; in a second state, digitizing the magnetic resonance signal output from one of the plurality of coils to two or more of the plurality of A/D converters, with said two or more of the plurality of A/D converters; and regenerating an image based on outputs of the plurality of A/D converters.

Additional objects and advantages of the invention will be set forth in the description which follows, and in unit will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a unit of the specification, illustrate embodiments of the invention, and together with the general description given above and the detailed description of the embodiments given below, serve to explain the principles of the invention.

FIG. 2 is a view showing a structure of a reception section shown in FIG. 1, according to the first embodiment of the present invention.

DETAILED DESCRIPTION OF THE INVENTION

Embodiments of the present invention will be explained with reference to the accompanying drawings.

Figure 1:
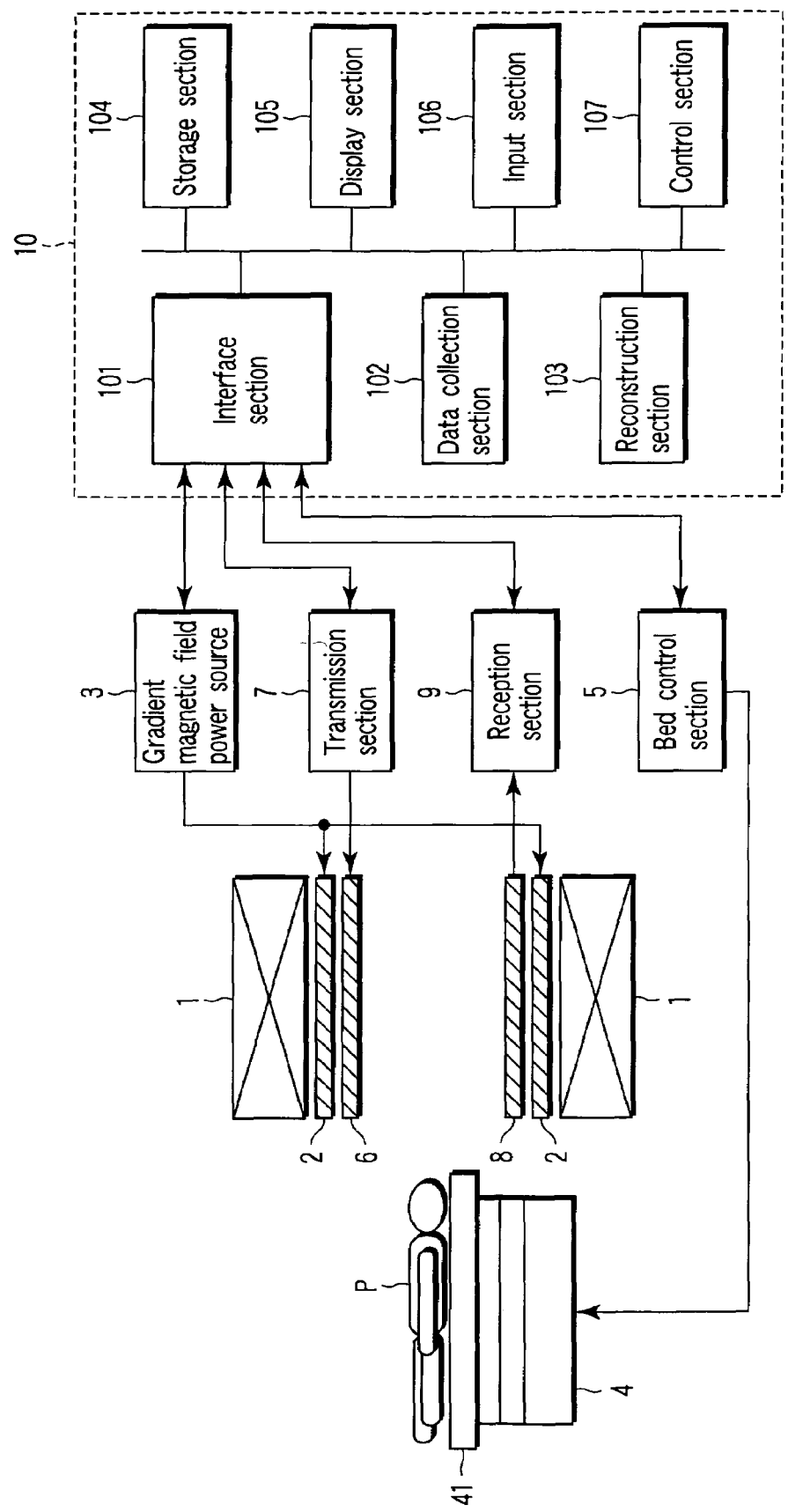
FIG. 1 is a view showing the structure of a magnetic resonance imaging apparatus according to each of the embodiments of the present invention.

FIG. 1 is a view showing the structure of a magnetic resonance imaging apparatus (which will be hereinafter referred to as MRI apparatus) according to each of the embodiments of the present invention. The MRI apparatus shown in FIG. 1 comprises a static field magnet 1, a gradient coil 2, a gradient magnetic field power supply 3, a bed 4, a bed control section 5, a transmission RF coil 6, a transmission section 7, a reception RF coil unit 8, a reception section 9 and a computer system 10.

Each of the static field magnet 1 is hollow and cylindrical, and generates a uniform static magnetic field in its internal space. As the static field magnet 1, for example, a permanent magnet or a superconducting magnet is used.

The gradient coil 2 is hollow and cylindrical, and are located inward of the static field magnet 1. The gradient coil 2 is provided as a set of three coils in connection with X, Y and Z axes perpendicular to each other, respectively. When receiving current supplied from the gradient magnetic field power supply 3, the above three coils, i.e., the gradient coil 2, generate gradient magnetic fields whose magnetic intensities vary in a gradient fashion along the X, Y and Z axes, respectively. Suppose the Z direction is the same as the direction in which, e.g., a static magnetic field acts. The gradient magnetic fields at the X, Y and Z axes correspond to, e.g., gradient magnetic fields Gs, Ge and Gr, respectively. The gradient magnetic field Gs arbitrarily determines a cross section to be imaged. The gradient magnetic field Ge changes the phase of a magnetic resonance signal in accordance with the spatial positions of portions of the gradient magnetic field Ge. The gradient magnetic field Gr changes the frequency of the magnetic resonance signal in accordance with the spatial positions.

A patient P to be examined is introduced into a region of space defined by the gradient coil 2, while lying on the top 41 of the bed 4. The bed 4 is driven by the bed control section 5 to move the top 41 in the longitudinal direction thereof and the vertical direction. Generally, the bed 4 is provided such that the longitudinal direction of the top 41 is parallel to the central axis of each static field magnet 1.

The transmission RF coil 6 is located inward of the gradient coil 2. The transmission RF coil 6 receives a high frequency pulse supplied from the transmission section 7, and generates a high frequency magnetic field.

The transmission section 7 incorporates an oscillation section, a phase selection section, a frequency conversion section, an amplitude modulation section and a high frequency power amplification section. The oscillation section produces a high frequency signal having a resonance frequency specific to atomic nuclei to be targeted in the static magnetic field. The phase selection section selects a frequency of the high frequency signal. The frequency conversion section converts the high frequency signal output from the phase selection section. The amplitude modulation section modulates the amplitude of the high frequency signal output from the frequency conversion section, in accordance with, e.g., a sync function. The high frequency power amplification section amplifies the high frequency signal output from the amplitude modulation section. Then, the transmission section 7 transmits a high frequency pulse corresponding to a Larmor frequency, which is obtained as a result of the operations of the above sections.

The reception RF coil unit 8 is located inward of the gradient coil 2. The reception RF coil unit 8 incorporates a plurality of RF coils, which receive a magnetic resonance signal radiated from the patient P due to an influence of the high frequency magnetic field thereon. Magnetic resonance signals output from the RF coils are output to the reception section 9.

The reception section 9 produces magnetic resonance signal data regarding a plurality of reception channels on the basis of the magnetic resonance signal output from the reception RF coil unit 8.

The computer system 10 includes an interface section 101, a data collection section 102, a reconstruction section 103, a storage section 104, a display section 105, an input section 106 and a control section 107.

To the interface section 101, the gradient magnetic field power supply 3, the bed control section 5, the transmission section 7 and the reception section 9 are connected. The interface section 101 inputs/outputs a signal to be transmitted between the computer system 10 and each of the gradient magnetic field power supply 3, the bed control section 5, the transmission section 7 and the reception section 9.

The data collection section 102 collects the magnetic resonance signal data output from the reception section 9 through the interface section 101. The data collection section 102 stores the collected magnetic resonance signal data in the storage section 104.

The reconstruction section 103 performs reconstruction processing such as Fourier transform on the magnetic resonance signal data stored in the storage section 104 to obtain spectrum data or image data on a desired nuclear spin in the patient P.

The storage section 104 stores magnetic resonance signal data and spectrum data or image data regarding each of patients.

The display section 105 displays each of various information such as the spectrum data and the image data under control of the control section 107. As the display section 105, a display device such as a liquid crystal display can be used.

The input section 106 receives an instruction from an operator or information input thereby. As the input section 106, an appropriate one of a pointing device such as a mouse or a track ball, a selection device such as a mode switch and an input device such as a keyboard can be used properly.

The control section 107 includes a CPU and a memory, etc., and takes an overall control of the MRI apparatus. Further, the control section 107 sends mode information to the reception section 9. The mode information indicates which of a plurality of imaging modes, which differ in imaging range from each other, is set.

FIRST EMBODIMENT

FIG. 2 is a view showing a structure of the reception section 9 shown in FIG. 1, according to the first embodiment of the present invention. Of the plurality of reception channels, only channels N and N+1 are shown in FIG. 2.

As shown in FIG. 2, the reception section 9 includes filters 901-$j$ and 901-$k$, a distributor 902, a switch 903, A/D converters 904-$j$ and 904-$k$, switches 905 and 906, a correcting/averaging circuit 907, a memory 908, a switch 909, digital signal processing sections 910-$j$ and 910-$k$ and an interface section 911.

To the filters 901-$j$ and 901-$k$, magnetic resonance signals output from RF coils 81-$j$ and 81-$k$ are input, respectively. The RF coils 81-$j$ and 81-$k$ are provided in association with the channels N and N+1, respectively. Accordingly, the filters 901-$j$ and 901-$k$ are provided in association with the channels N and N+1, respectively. The filters 901-$j$ and 901-$k$ are antialiasing filters having band-pass characteristics suitable for sampling bands of the A/D converters 904-$j$ and 904-$k$.

It should be noted that, referring to FIG. 2, the elements indicated by reference numerals including the suffixes -j and -k, such as the filters 901-j and 901-k, are associated with the channels N and N+1 of the plurality of reception channels, respectively The distributor 902 divides an output signal from the filter 901-j into two output signals. The switch 903 selectively outputs the output signal of the filter 901-k and those of the distributor 902.

The A/D converter 904-j digitizes the output signal of the distributor 902. The A/D converter 904-k digitizes the output signal of the switch 903.

The switch 905 selects the correcting/averaging circuit 907 or the switch 909. The switch 906 selects the correcting/averaging circuit 907 or the digital signal processing section 910-j.

The correcting/averaging circuit 907 corrects the output signals of the A/D converters 904-j and 904-k to compensate for the difference in electrical characteristics between the A/D converters 904-j and 904-k. The correcting/averaging circuit 907 averages the corrected signals. The memory 908 stores correction data regarding the difference between the channels, which is used when the above correction is carried out by the correcting/averaging circuit 907.

The switch 909 selectively outputs the output signal of the A/D converter 904-j, which is supplied through the switch 905, and the output signal of the correcting/averaging circuit 907.

The digital signal processing section 910-j performs necessary signal processing on the output signal of the switch 909. As this signal processing, for example, orthogonal detection (digital frequency conversion and generation of orthogonal data) based on digitized data, or filter processing based on the digitized data or signal thinning processing is carried out. The digital signal processing section 910-j outputs the signal on which the above processing is performed, as magnetic resonance signal data 6f the channel N. The digital signal processing section 910-k performs necessary signal processing on the output signal of the switch 906. The digital signal processing section 910-k outputs the signal on which the signal processing is performed, as magnetic resonance signal data of the channel N+1.

To the interface section 911, magnetic resonance signal data of other channels is input in addition to the above magnetic resonance signal data of the channels N and N+1. The interface section 911 sends those magnetic signal data to the computer system 10. The interface section 911 receives mode information sent from the computer system 10. The interface section 911 then gives the mode information to the switches 903, 905, 906 and 909.

Next, a characteristic operation of the MRI apparatus according to the first embodiment of the present invention will be explained.

The imaging modes of the MRI apparatus according to the first embodiment include a first imaging mode in which the channels N and N+1 are both used, and a second imaging mode in which the channel N is used, and the channel N+1 is not used.

When the mode information indicates the first imaging mode, the switches 903, 905, 906 and 909 enter respective selected states indicated by broken lines in FIG. 2. To be more specific, in the first imaging mode, first and second processing systems are provided separately. The first processing system comprises the filter 901-j, the distributor 902, the A/D converter 904-j, the switches 905 and 909 and the digital signal processing section 910-j. The second processing system comprises the filter 901-k, the switch 903, the A/D converter 904-k, the switch 906 and the digital signal processing section 910-k. The first processing system processes the magnetic resonance signal of the channel N which is output from the RF coil 81-j. The second processing system processes the magnetic resonance signal of the channel N+1 which is output from the RF coil 81-k.

In such a manner, in the first imaging mode, the reception section 9 performs reception processings regarding the channels N and N+1 in parallel with each other. At this time, the A/D converters 904-j and 904-k are allocated to the channels N and N+1, respectively.

Figure 3:
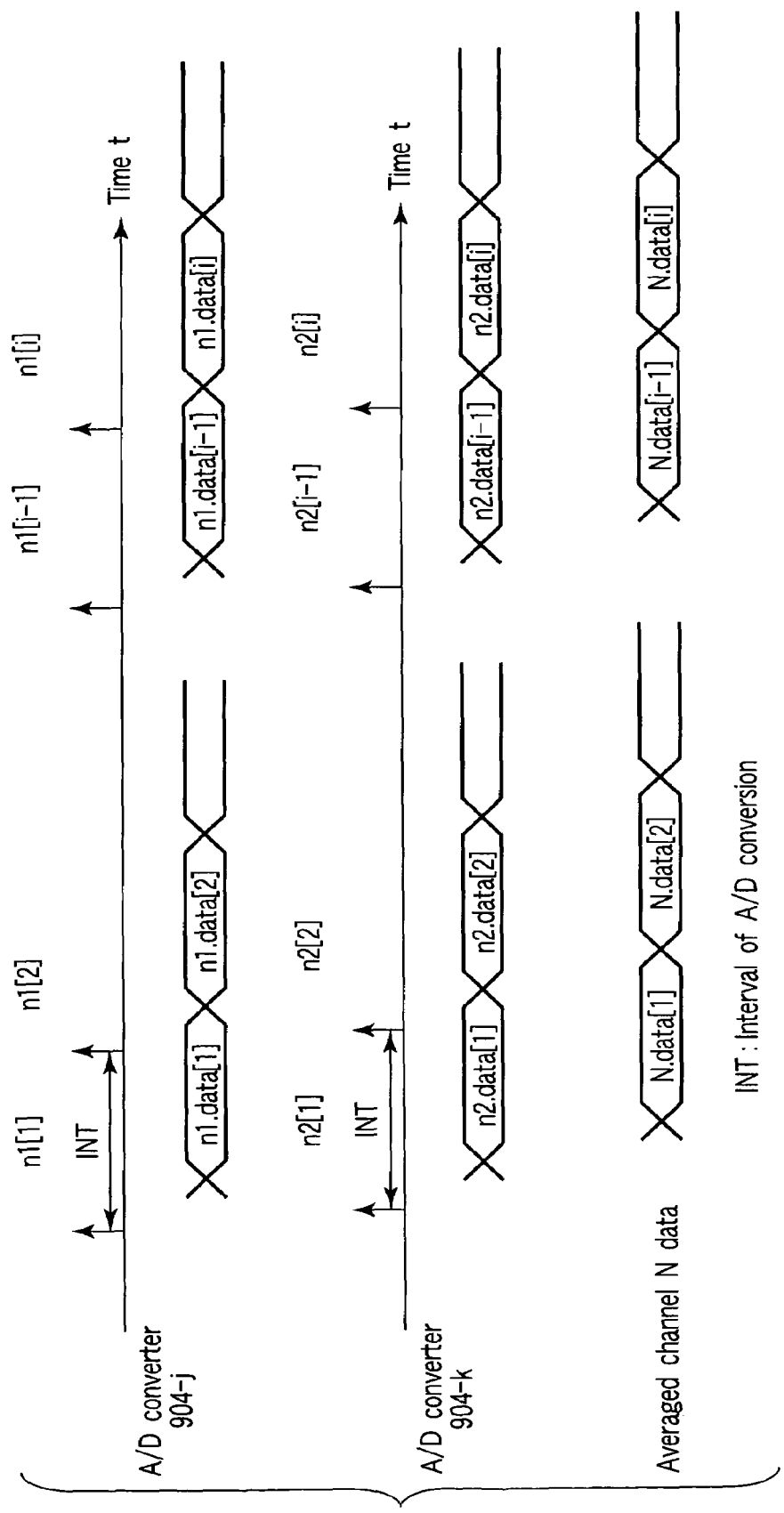
FIG. 3 is a view showing a relationship between sampling timings of A/D converters shown in FIG. 2 in the first embodiment and data of a channel N which is produced such that the data is averaged.

When the mode information indicates the second imaging mode, the switches 903, 905, 906 and the 909 enter respective selected states indicated by solid lines in FIG. 2. Therefore, in the second imaging mode, the magnetic resonance signal of the channel N+1 is not subjected to the reception processing by the reception section 9. The magnetic resonance signals, into which the magnetic resonance signal of the N channel is divided by the distributor 902, are input to the A/D converts 904-j and 904-k, respectively. These signals are digitized by the A/D converts 904-j and 904-k, respectively. At this time, the A/D converts 904-j and 904-k start to perform conversion at the same time as shown in FIG. 3.

The output data of the A/D convert 904-j and that of the A/D converter 904-k are input to the correcting/averaging circuit 907. The correcting/averaging circuit 907 corrects direct current components DC and the difference between amplification degrees with respect to the A/D converts 904-j and 904-k by using the correction data regarding the difference between the channels, which is stored in the memory 908. The above correction is performed in such a manner as to compensate for the difference in electrical characteristics between the A/D converts 904-j and 904-k. Also, it should be noted that estimates of the direct current components DC can be obtained from non-signal data. An estimate of an amplification degree ratio G(j, k) indicating the difference in amplification degree between the channels can be obtained by collecting sine wave data. Then, the correcting/averaging circuit 907 performs averaging processing on the above two corrected data. Data of one system which is obtained by the averaging processing is given to the digital signal processing section 910-j as magnetic resonance signal data received with respect to the channel N. The magnetic resonance signal data is sent to the computer system 10 after being processed by the digital signal processing section 910-j as occasion arises.

Data n1.data and data n2.data respectively obtained by the A/D converts 904-j and 904-k comprise signals and noise components as expressed by the following equations (1) and (2):

$$n1.\text{data} = S + <\text{noise1}> + <\text{noise2'}> + <\text{noise3'}> \quad (1)$$

$$n2.\text{data} = G(j,k)(S + <\text{noise1}> + <\text{noise2''}> + <\text{noise3''}>) + DC \quad (2)$$

Where S is a magnetic resonance signal detected at the RF coil 81-j, <noise1> is a noise generating between the RF coil 81-j and the distributor 902, <noise2'> is a noise generating between the distributor 902 and the inside of the A/D converter 904-j, <noise2''> is a noise generating between the distributor 902 and the AD converter 904-k, <noise3'> is a quantization noise generating at the A/D converter 904-j, <noise3''> is a quantization noise generating at the A/D converter 904-j, DC is a direct current component in the output of the A/D converter 904-k, and G(j, k) is an amplification degree ratio of amplification processing of the A/D converter 904-k to that of the A/D converter 904-j.

It should be noted that <noise1>, <noise2'> and <noise2"> are noises generating due to thermal noises or the like generated at a circuit element, and also that <noise3'> and <noise3"> are quantization noises generated due to discretization of data which is determined in accordance with the number of bits to be processed in the A/D converter 904-$j$.

In the case where the amplification degree ratio G(j, k) and the direct current component DC is sufficiently negligible, or they are properly corrected, the amplification degree ratio G(j, k) is substantially "1", and the direct current component DC is substantially "0". Thus, new data N.data obtained by averaging the data items n1.data and n2.data is expressed by equation (3) below. It should be noted that actually, an i-th pair of data items n1.data[i] and n2.data[i] subjected to AD conversion at the same time as shown in FIG. 3 are averaged.

$$N.\text{data}=(n1.\text{data}+n2.\text{data})/2=S+<\text{noise1}>+(<\text{noise2'}>+<\text{noise2"}>)/2+(<\text{noise3'}>+<\text{noise3"}>)/2 \quad (3)$$

In such a manner, the magnetic resonance signal S and the noise <noise1>, which completely correlate with each other in time, are simply added. The sum of the noises <noise2'> and <noise2">, which do not correlate with each other in time since they are generated from different sources, is determined as the root of the sum of squares. The quantization noises <noise3'> and <noise3"> are handled in the same manner as the noises <noise2'> and <noise2">. The noises <noise2'> and <noise2"> and the quantization noises <noise3'> and <noise3"> are generated from the same kind of circuit elements, and can thus be handled as noises having the same level. Accordingly, the equation (3) can be changed to the following equation (4):

$$N.\text{data}=S+\text{noise1}+<\text{noise2'}>/\text{Sqrt}(2)+<\text{noise3'}>/\text{Sqrt}(2) \quad (4)$$

In the case where the noise <noise2'> and the quantization noise <noise3'> greatly influence a signal-to-noise ratio (SN), and the influence of the noise <noise1> on the SN is negligible, it can be found that from the equation (1) that the SN is expressed by the following equation (5):

$$SN=S/(<\text{noise2'}>+<\text{noise3'}>) \quad (5)$$

In the case where the A/D converters 904-$j$ and 904-$k$ are driven, it can be found from the equation (4) that a signal-to-noise ratio (SN') is expressed by the following equation (6):

$$SN'=S/(<\text{noise2'}>/\text{Sqrt}(2)+<\text{noise3'}>/\text{Sqrt}(2)) \quad (6)$$

When the equations (5) and (6) are compared with each other, it can be found that the signal-to-noise ratio of the data N.data is improved, i.e., it is Sqrt(2) times higher than that in the case where only the A/D converter 904-$j$ is driven to perform processing as in the first imaging mode.

In such a manner, according to the first embodiment, the signal-to-noise ratio is improved. When the signal-to-noise ratio is improved, a signal component of low level included in the magnetic resonance signal is not influenced by noise, and becomes an effective signal, thus increasing the dynamic range. In such a manner, the A/D converter 904-$k$ provided for the channel N+1, which is not used in the second imaging mode, can be effectively applied to the reception processing of the channel N.

SECOND EMBODIMENT

Figure 4:
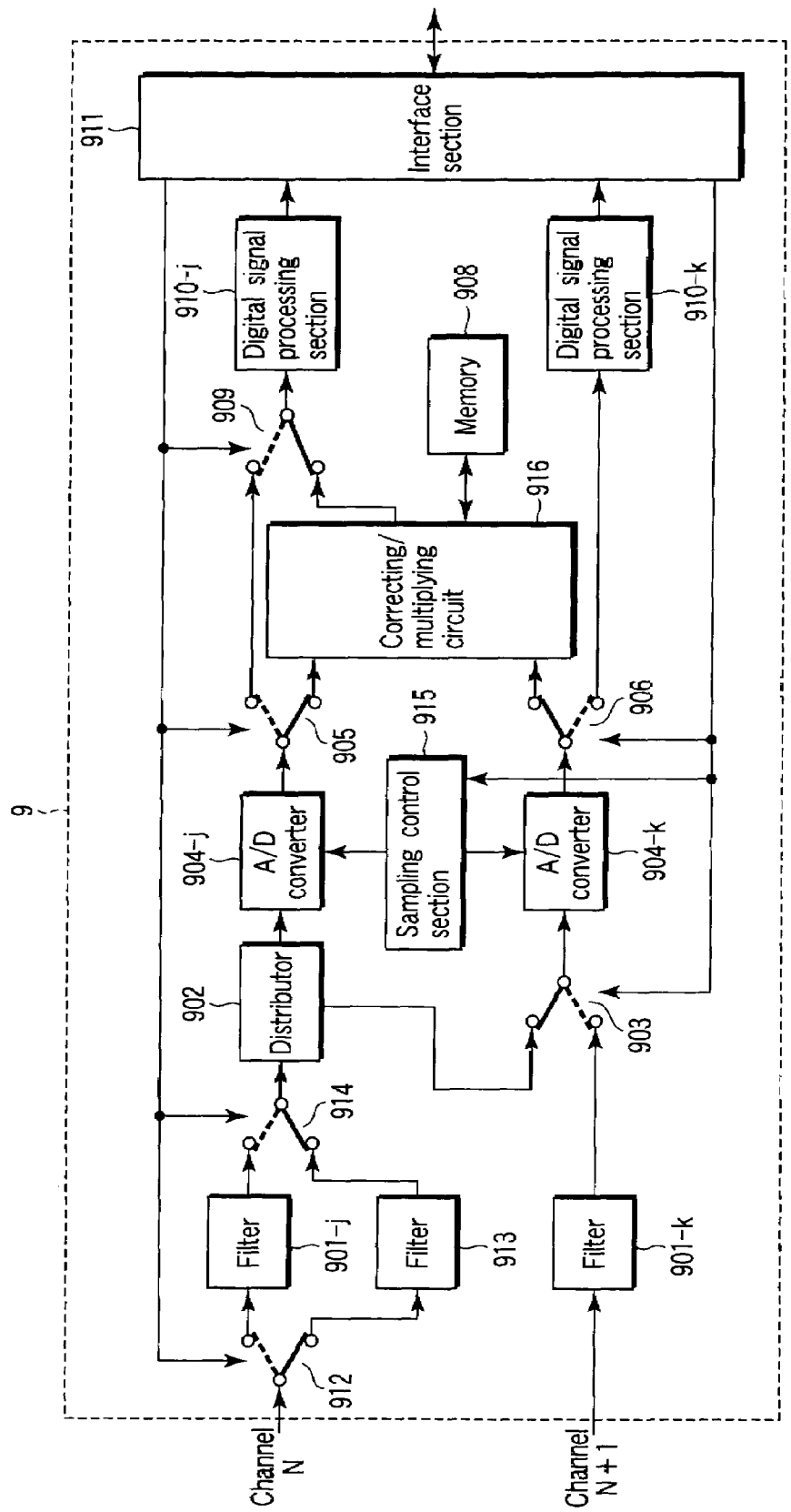
FIG. 4 is a view showing another structure of the reception section shown in FIG. 1, according to the second embodiment of the present invention.

FIG. 4 is a block diagram showing another structure of the reception section 9, i.e., the structure thereof according to the second embodiment of the present invention. It should be noted that in FIG. 4, the same elements as in FIG. 2 are denoted by the same reference numerals and signs, respectively, and their detail explanations will be omitted.

As shown in FIG. 4, the reception section 9 comprises the filters 901-$j$ and 901-$k$, the distributor 902, the switch 903, the A/D converters 904-$j$ and 904-$k$, the switches 905 and 906, the memory 908, the switch 909, the digital signal processing sections 910-$j$ and 910-$k$, the interface section 911, a switch 912, a filter 913, a switch 914, a sampling control section 915 and a correcting/multiplying circuit 916.

That is, the reception section 9 according to the second embodiment employs the correcting/multiplying circuit 916 in place of the correcting/averaging circuit 907 used in the first embodiment, and further includes the switch 912, the filter 913, the switch 914 and the sampling control section 915.

The switch 912 selects the filter 901-$j$ or the filter 913. The filter 913 is an antialiasing filter having band-pass characteristics suitable for a sampling band which is two times wider than that of the A/D converter 904-$j$. The switch 914 selectively outputs the output signals of the filters 901-$j$ and filter 913.

The sampling control section 915 shifts the sampling timings of the A/D converters 904-$j$ and 904-$k$ relative to each other by an interval which is half an interval INT.

The correcting/multiplying circuit 916 corrects the output signals of the A/D converters 904-$j$ and 904-$k$ in the same manner as the correcting/averaging circuit 907. Then, the correcting/multiplying circuit 916 alternately selects and multiples the corrected output signals.

Next, a characteristic operation of an MRI apparatus according to the second embodiment of the present invention will be explained.

The MRI apparatus according to the second embodiment has the first and second imaging modes as in the first embodiment.

When the mode information indicates the first imaging mode, the switches 903, 905, 906, 909, 912 and 914 enter respective selected state indicated by broken lines in FIG. 4. Therefore, in the first imaging mode, the MRI apparatus operates in the same manner as in the first embodiment.

When the mode information indicates the second imaging mode, the switches 903, 905, 906, 909, 912 and 914 enter respective selected states indicated by solid lines in FIG. 4. Therefore, in the second imaging mode, the magnetic resonance signal of the channel N is input to the distributor 902 through the filter 913.

Figure 5:
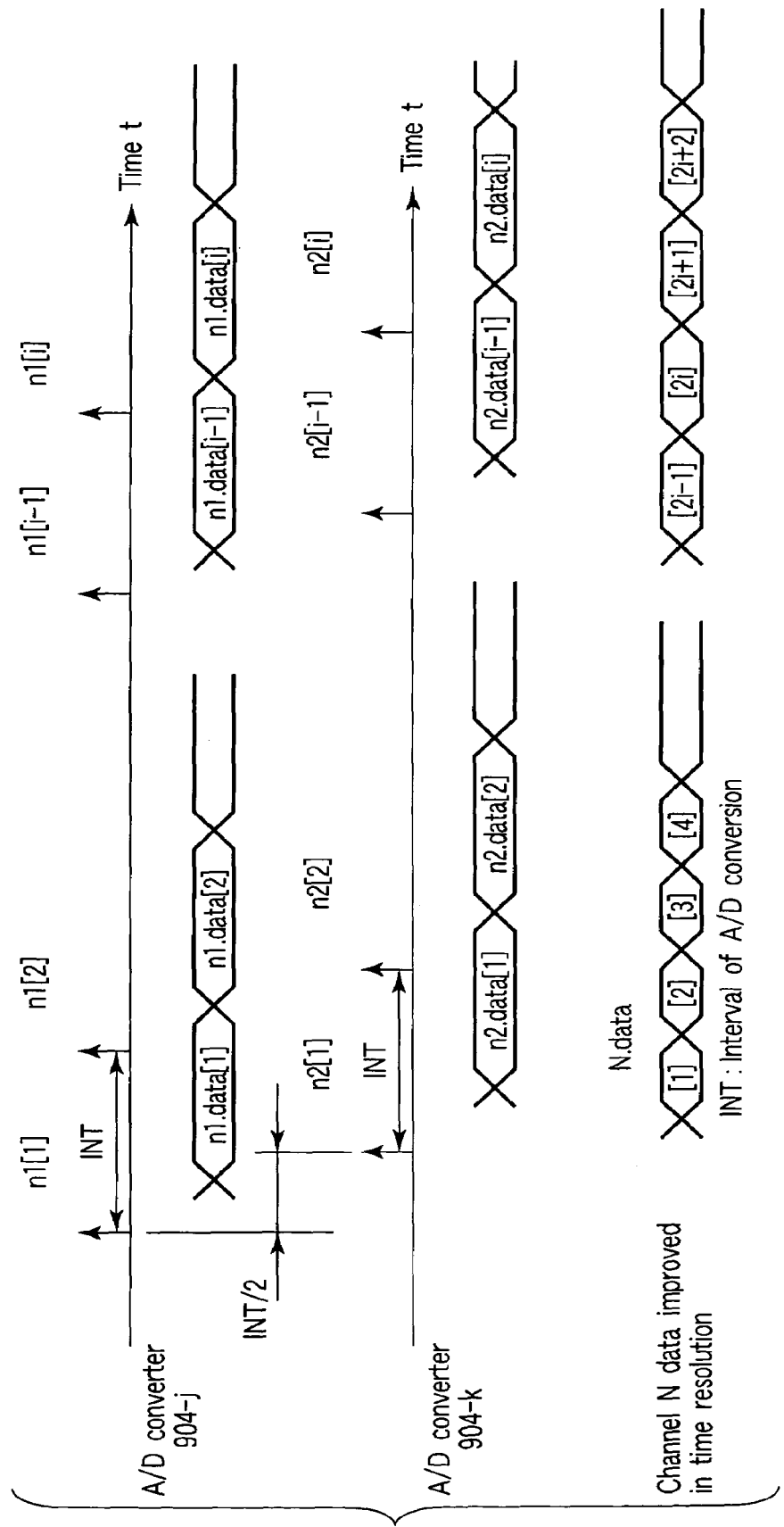
FIG. 5 is a view showing a relationship between sampling timings of the A/D converters in FIG. 4 in the second embodiment and data of the channel N which is produced such that the data is multiplexed.

Furthermore, when the mode information indicates the second imaging mode, the sampling control section 915 shifts the sampling timings of the A/D converters 904-$j$ and 904-$k$ relative to each other by an interval which is half the interval INT as shown in FIG. 5.

The output data of the A/D converter 904-$j$ and that of the A/D converter 904-$k$ are both input to the correcting/multiplying circuit 916. The correcting/multiplying circuit 916 corrects the direct current components DC of the output data of the A/D converters 904-$j$ and 904-$k$ and the difference between the amplification degrees with respect to the output data of the A/D converters 904-$j$ and 904-$k$ as in the correcting/averaging circuit 907 used in the first embodiment. The correcting/multiplying circuit 916 alternately selects and multiplies the corrected output data as shown in FIG. 5. Data of one system which is obtained by the above multiplying processing is given to the digital signal processing section 910-$j$ as magnetic resonance signal data received with respect to the channel N. The magnetic resonance signal data is sent to the computer system 10 by the interface section 911 after being processed by the digital signal processing section 910-*j* as occasion arises.

In such a manner, the A/D converters 904-*j* and 904-*k* alternately perform A/D conversion at sampling intervals for A/D conversion. After being corrected, the data items n1.data and n2.data obtained by the above conversion are combined into data N.data in which the data items n1.data and n2.data are alternately arranged in time as indicated by the following equations:

$$N.\text{data}[2i-1]=n1.\text{data}[i]$$

$$N.\text{data}[2i]=(n2.\text{data}[i]-DC)\times G(j,k)$$

$$i=1, 2, \ldots, m-1, m$$

Where N.data[i] is i-th data whose data length corresponds to a sampling interval which is half the interval INT, n1.data[i] is i-th data obtained by the A/D conversion processing of the A/D converter 904-*j*, and n2.data[i] is i-th data obtained by the A/D conversion processing of the A/D converter 904-*k*.

In such a manner, according to the second embodiment, data can be collected in a time resolution which is half that guaranteed by the A/D converters 904-*j* and 904*k*. In such a manner, the A/D converter 904-*k* provided for the channel N, which is not applied to the second imaging mode, can be effectively used in reception processing of the channel N.

Furthermore, according to the second embodiment, in the second imaging mode, the sampling frequency for the channel N is double that in the first imaging mode. Therefore, switching between the filters 901-*i* and 913 is effected in accordance with the sampling frequency double that in the first imaging mode. Thus, returning of the magnetic resonance signal is restricted due to the band-pass characteristics suitable for the sampling frequencies of the first and second imaging modes. As a result, the reception band is increased.

In the first or second embodiment, the first and second imaging modes are, e.g., a wide range mode and a narrow range mode, respectively, which are different from each other in imaging range. In the wide range mode, for example, 32 RF coils are all used to receive MR signals in a wide range. In the narrow range mode, for example, 8 RF coils are used to receive MR signals in a range narrower than the above wide range. In addition, in the wide range mode, 32 A/D converters are connected to the 32 RF coils, respectively. In the narrow range mode, plural A/D converters are connected to each of the 8 RF coils.

Moreover, in the first or second embodiment, the first and second imaging modes are, e.g., a dynamic range priority mode and a speed priority mode, respectively. In the dynamic range priority mode, for example, the 32 RF coils are all used to achieve a wide dynamic range. In the speed priority mode, the RF coils to be used are limited to, e.g., 8 RF coils, to achieve high-speed scanning. In addition, in the dynamic range priority mode, the 32 RF coils are connected to the 32 A/D converters, respectively. In the speed priority mode, a plurality of A/D converters are connected to the 8 RF coils.

In the above case, in the second imaging mode, in order that the same number of A/D converters be connected to each of the RF coils, the number is set to 2, 3 or 4. However, different numbers of A/D converters may be connected to the RF coils. For example, 6 A/D converters may be connected to one RF coil, and 2 A/D converters be connected to another RF coil.

The above embodiments can be variously modified as follows:

In each of the embodiments, in the case where the difference between the electrical characteristics of the A/D converters 904-*j* and 904-*k* is small, the correction processing of the correcting/averaging circuit 907 or correcting/multiplying circuit 916 can be omitted.

In each embodiment, three or more A/D converters can be provided, and the output data of the three or more A/D converters can be averaged or multiplied.

In each embodiment, in the case where the A/D converters 904-*j* and 904-*k* are both allocated to one channel, processing of the output data of the A/D converters 904-*j* and 904-*k* is not limited to averaging or multiplying processing, that is, the output data of the A/D converters 904-*j* and 904-*k* may be processed by an arbitrary method.

Furthermore, in each embodiment, the MRI apparatus includes a cylindrical gantry. However, an MRI apparatus provided with an open-type gantry may be employed. In addition, a so-called short-axis MRI apparatus provided with, e.g., a short cylindrical gantry, may be adopted.

In each embodiment, three or more imaging modes may be provided, and be different from each other in the number of A/D converters to be connected to each RF coil.

In the second embodiment, the sampling timings of the A/D converters 904-*j* and 904-*k* may be shifted relative to each other by an interval other than the ½ interval.

In the second embodiment, if it is not necessary to increase the reception band, the switches 912, 913 and 914 can be omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
a plurality of coils which receive magnetic resonance signals;
a plurality of A/D converters which digitize the magnetic resonance signals; and
a set unit which selectively sets a first state and a second state, the first state being set as a state in which the magnetic resonance signals output from the plurality of coils are input to the plurality of A/D converters, respectively, the second state being set as a state in which the magnetic resonance signal output from one of the plurality of coils is input to two or more of the plurality of A/D converters.

2. The magnetic resonance imaging apparatus according to claim 1, wherein the number of the plurality of A/D converters is equal to the plurality of coils.

3. The magnetic resonance imaging apparatus according to claim 1, which further comprises a unit which averages output signals of said two or more of the plurality of A/D converters, when the second state is set.

4. The magnetic resonance imaging apparatus according to claim 3, which further comprises a unit which corrects the output signals of said two or more of the plurality of A/D converters to compensate for a difference in electrical characteristics between said two or more of the plurality of AD converters, when the second state is set.

5. The magnetic resonance imaging apparatus according to claim 1, which further comprises:

a unit which shifts sampling timings of said at two or more of the plurality of A/D converters relative to each other, when the second state is set; and a unit which sequentially selects and outputs output signals of said two or more of the plurality of A/D converters at timings set based on the sampling timings.

6. The magnetic resonance imaging apparatus according to claim 5, which further comprises:

first and second filters having different band-pass characteristics; and a unit which causes the magnetic resonance signal, which is input to said two or more of the plurality of A/D converters when the second state is set, to pass through the first filter, when the first state is set, and to pass through the second filter, when the second state is set.

7. The magnetic resonance imaging apparatus according to claim 6, which further comprises a unit which corrects the outputs signals of said two or more of the plurality of A/D converters to compensate for compensate for a difference in electrical characteristics between said two or more of the A/D converters, when the second state is set.

8. The magnetic resonance imaging apparatus according to claim 1, wherein a wide range mode and a narrow range mode are provided which differ from each other in imaging range, and which further comprises a unit which performs a control for causing the set unit to set the first state when the wide range mode is set, and to set the second state when the narrow range mode is set.

9. The magnetic resonance imaging apparatus according to claim 1, which further comprises a unit which performs a control for causing the set unit to set the first state when a mode in which a dynamic range has higher priority than a scanning speed is set, and to set the second state when a mode in which the scanning speed has higher priority than the dynamic range.

10. A magnetic resonance imaging apparatus comprising:

a static magnetic field coil which applies a static magnetic field to an object to be examined;

a gradient coil which applies a gradient magnetic field to the object;

a plurality of coils which receive magnetic resonance signals from the object;

a plurality of A/D converters which digitize the magnetic resonance signals;

a unit which selectively set a first state and a second state, the first state being set as a state in which the magnetic resonance signals output from the plurality of coils are input to the plurality of A/D converters, respectively, the second state being set as a state in which the magnetic resonance signal output from one of the plurality of coils is input to two or more of the plurality of A/D converters, and a unit which reconstructs an image based on outputs of the plurality of A/D converters.

11. The magnetic resonance imaging apparatus according to claim 10, wherein the number of the plurality of A/D converters is equal to the plurality of coils.

12. The magnetic resonance imaging apparatus according to claim 10, which further comprises a unit which averages output signals of said two or more of the plurality of A/D converters, when the second state is set.

13. The magnetic resonance imaging apparatus according to claim 12, which further comprises a unit which corrects the output signals of said two or more of the plurality of A/D converters to compensate for a difference in electrical characteristics between said two or more of the plurality of AD converters, when the second state is set.

14. The magnetic resonance imaging apparatus according to claim 10, which further comprises:

a unit which shifts sampling timings of said two or more of the plurality of A/D converters relative to each other, when the second state is set; and a unit which sequentially selects and outputs output signals of said two or more of the A/D converters at timings based on the sampling timings.

15. The magnetic resonance imaging apparatus according to claim 14, which further comprises:

first and second filters having different band-pass characteristics; and a unit which causes the magnetic resonance signal, which is input to said two or more of the plurality of A/D converters when the second state is set, to pass through the first filter, when the first state is set, and to pass through the second filter, when the second state is set.

16. The magnetic resonance imaging apparatus according to claim 15, which further comprises a unit which corrects the output signals of said two or more of the A/D converters to compensate for a difference in electrical characteristics between said two or more of the A/D converters.

17. The magnetic resonance imaging apparatus according to claim 10, wherein a wide range mode and a narrow range mode are provided which differ from each other in imaging range, and which further comprises a unit which performs a control for causing the set unit to set the first state when the wide range mode is set, and to set the second state when the narrow range mode is set.

18. The magnetic resonance imaging apparatus according to claim 10, which further comprises a unit which performs a control for causing the set unit to set the first state when a mode in which a dynamic range has higher priority than a scanning speed is set, and to set the second state when a mode in which the scanning speed has higher priority than the dynamic range.

19. A magnetic resonance imaging method comprising:

receiving magnetic resonance signals with a plurality of coils;

in a first state, digitizing the magnetic resonance signals output from the plurality of coils, with a plurality of A/D converters; and in a second state, digitizing the magnetic resonance signal output from one of the plurality of coils to two or more of the plurality of A/D converters, with said two or more of the plurality of A/D converters.

20. The magnetic resonance imaging method according to claim 19, wherein in the second state, output signals of said two or more of the plurality of A/D converters are averaged.

21. The magnetic resonance imaging method according to claim 20, wherein in the second state, the output signals of said two or more of the plurality of A/D converters are corrected to compensate for a difference in electrical characteristics between said two or more of the plurality of A/D converters.

22. The magnetic resonance imaging method according to claim 19, wherein in the second state, sampling timings of said two or more of the plurality of A/D converters are shifted relative to each other, and output signals of said two or more of the plurality of A/D converters are sequentially selected and output at timings based on the sampling timings.

23. The magnetic resonance imaging method according to claim 22, wherein the magnetic resonance signal, which is input to said two or more of the plurality of A/D converters in the second state, is caused to pass through a first filter in the first state, and to pass through a second filter in the second state, the second filter having band-pass characteristics different from those of the first filter.

24. The magnetic resonance imaging method according to claim 23, wherein in the second state, the output signals of said two or more of the plurality of A/D converters are corrected to compensate for a difference in electrical characteristics between said two or more of the plurality of A/D converters.

25. The magnetic resonance imaging method according to claim 19, wherein a wide range mode and a narrow range mode are provided which differ from each other in imaging range, and which further comprises controlling to set the first state when the wide range mode is set, and to set the second state when the narrow range mode is set.

26. The magnetic resonance imaging method according to claim 19, which further comprises controlling to set the first state when a mode in which a dynamic range has higher priority than a scanning speed is set, and to set the second state when a mode in which the scanning speed has higher priority than the dynamic range.

27. A magnetic resonance imaging method comprising:
applying a static magnetic field to an object to be examined;
applying a gradient magnetic field to the object;
receiving magnetic resonance signals from the object with a plurality of coils;
in a first state, digitizing the magnetic resonance signals output from the plurality of coils, with a plurality of A/D converters;
in a second state, digitizing the magnetic resonance signal output from one of the plurality of coils to two or more of the plurality of A/D converters, with said two or more of the plurality of A/D converters; and
regenerating an image based on outputs of the plurality of A/D converters.

28. The magnetic resonance imaging method according to claim 27, wherein in the second state, output signals of said two or more of the plurality of A/D converters are averaged.

29. The magnetic resonance imaging method according to claim 28, wherein in the second state, the output signals of said two or more of the plurality of A/D converters are corrected to compensate for a difference in electrical characteristics between said two or more of the plurality of A/D converters.

30. The magnetic resonance imaging method according to claim 27, wherein in the second state, sampling timings of said two or more of the plurality of A/D converters are shifted relative to each other, and output signals of said two or more of the plurality of A/D converters are sequentially selected and output at timings based on the sampling timings.

31. The magnetic resonance imaging method according to claim 30, wherein the magnetic resonance signal, which is input to said two or more of the plurality of A/D converters in the second state, is caused to pass through a first filter in the first state, and to pass through a second filter in the second state, the second filter having band-pass characteristics different from those of the first filter.

32. The magnetic resonance imaging method according to claim 31, wherein in the second state, the output signals of said two or more of the plurality of A/D converters are corrected to compensate for a difference in electrical characteristics between said two or more of the plurality of A/D converters.

33. The magnetic resonance imaging method according to claim 27, wherein a wide range mode and a narrow range mode are provided which differ from each other in imaging range, and which further comprises controlling to set the first state when the wide range mode is set, and to set the second state when the narrow range mode is set.

34. The magnetic resonance imaging method according to claim 27, which further comprises controlling to set the first state when a mode in which a dynamic range has higher priority than a scanning speed is set, and to set the second state when a mode in which the scanning speed has higher priority than the dynamic range.

* * * * *